(12) United States Patent
Takai et al.

(10) Patent No.: US 8,889,441 B2
(45) Date of Patent: Nov. 18, 2014

(54) METHOD FOR MANUFACTURING WAFER-BONDED SEMICONDUCTOR DEVICE

(75) Inventors: Toshiaki Takai, Yokohama (JP); Yukio Sakigawa, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 73 days.

(21) Appl. No.: 13/519,590

(22) PCT Filed: Oct. 27, 2010

(86) PCT No.: PCT/JP2010/006334
§ 371 (c)(1),
(2), (4) Date: Sep. 25, 2012

(87) PCT Pub. No.: WO2011/121686
PCT Pub. Date: Oct. 6, 2011

(65) Prior Publication Data
US 2013/0029438 A1 Jan. 31, 2013

(30) Foreign Application Priority Data

Mar. 29, 2010 (JP) .................................. 2010-074081

(51) Int. Cl.
*H01L 21/26* (2006.01)
*H01L 31/18* (2006.01)
(Continued)

(52) U.S. Cl.
CPC ....... *H01L 23/10* (2013.01); *H01L 2224/83121* (2013.01); *H04L 2224/29082* (2013.01); *H01L 2224/32237* (2013.01); *H01L 2224/05155*
(Continued)

(58) Field of Classification Search
USPC .......................................................... 438/116
See application file for complete search history.

(56) References Cited

U.S. PATENT DOCUMENTS 6,409,866 B1 * 6/2002 Yamada ..................... 156/219
7,897,264 B2   3/2011 Bunyan
(Continued)

FOREIGN PATENT DOCUMENTS

JP      62-45465      2/1987
JP      7-136795      5/1995
(Continued)

*Primary Examiner* — Angel Roman
(74) *Attorney, Agent, or Firm* — Antonelli, Terry, Stout & Kraus, LLP.

(57) ABSTRACT

The invention provides a wafer-bonded semiconductor device wherein warpage generated when wafers are bonded is reduced at a low cost ad through a simple process.
In a method for manufacturing a wafer-bonded semiconductor device by bonding a first wafer substrate and a second wafer substrate together, the method of the invention includes a first step of forming in advance bonding members having a bonding function when heated on the wafer-bonded surface sides of the first wafer substrate and the second wafer substrate, respectively; a second step of supplying flux paste containing two or more kinds of powdery materials having reactivity to the surfaces of the bonding members formed in the first step; and a third step of causing excitation to have the flux paste supplied in the second step start reacting.

26 Claims, 5 Drawing Sheets

(51) Int. Cl.
- *H01L 33/48* (2010.01)
- *H01L 21/50* (2006.01)
- *H01L 27/146* (2006.01)
- *H01L 23/10* (2006.01)
- *H01L 33/00* (2010.01)
- *H01S 5/42* (2006.01)
- *H01L 23/00* (2006.01)
- *H01S 5/022* (2006.01)

(52) U.S. Cl.
CPC (2013.01); *H01L 2924/3656* (2013.01); *H01L 2224/83193* (2013.01); *H01L 2224/05644* (2013.01); *H01L 21/50* (2013.01); *H01L 2224/8381* (2013.01); *H01L 2224/293* (2013.01); *H01L 2224/8321* (2013.01); *H01L 2224/2919* (2013.01); *H01L 2924/09701* (2013.01); *H01L 33/0079* (2013.01); *H01L 2924/3511* (2013.01); *H01S 5/423* (2013.01); *H01L 2224/291* (2013.01); *H01L 2224/83801* (2013.01); *H01L 2224/2745* (2013.01); *H01L 24/05* (2013.01); *H01L 2224/83192* (2013.01); *H01L 24/27* (2013.01); *H01L 2224/83011* (2013.01); *H01L 24/83* (2013.01); *H01L 2224/83862* (2013.01); *H01L 2224/2732* (2013.01); *H01L 2224/83815* (2013.01); *H01L 2224/29355* (2013.01); *H01L 2924/01327* (2013.01); *H01L 2924/3651* (2013.01); *H01S 5/02208* (2013.01); *H01S 5/02272* (2013.01); *H01L 24/29* (2013.01); *H01L 2224/04026* (2013.01); *H01S 5/02296* (2013.01); *H01L 2224/29324* (2013.01); *H01L 2224/29294* (2013.01); *H01L 27/14618* (2013.01); *H01L 2224/83444* (2013.01); *H01L 2924/15159* (2013.01); *H01L 2224/32225* (2013.01); *H01L 2224/29363* (2013.01); *H01L 2224/29366* (2013.01)

USPC .......... 438/27; 438/25; 438/26; 438/116; 438/119; 438/455; 257/E21.001

(56) References Cited

U.S. PATENT DOCUMENTS

| | | | |
|---|---|---|---|
| 2003/0104651 A1* | 6/2003 | Kim et al. | 438/106 |
| 2005/0042838 A1* | 2/2005 | Garyainov et al. | 438/455 |
| 2005/0082552 A1* | 4/2005 | Fang et al. | 257/81 |
| 2005/0133572 A1* | 6/2005 | Brese et al. | 228/180.22 |
| 2005/0157374 A1* | 7/2005 | Tarn | 359/291 |
| 2006/0252167 A1* | 11/2006 | Wang | 438/27 |
| 2007/0278649 A1 | 12/2007 | Hirose et al. | |

FOREIGN PATENT DOCUMENTS

| | | |
|---|---|---|
| JP | 9-300094 | 11/1997 |
| JP | 2007-324465 | 12/2007 |
| JP | 2009-177034 | 8/2009 |
| JP | 2009-530867 | 8/2009 |

* cited by examiner

METHOD FOR MANUFACTURING WAFER-BONDED SEMICONDUCTOR DEVICE

TECHNICAL FIELD

This invention relates to a wafer bonding process for reducing warpage of a wafer level package (WLP) that bonds wafers to each other.

BACKGROUND ART

Resin molding that uses a mold resin has been dominant in the past as a packaging method of semiconductor devices. In recent years, however, the application of wafer level package capable of reducing not only a package cost but also a package size has been expanded. In wafer level packaging, a semiconductor wafer and a cap wafer are bonded by various kinds of methods. The bonding methods can be broadly classified into a direct bonding method that directly bonds the wafers to each other and an indirect bonding method that bonds the wafers by using bonding members. Anodic bonding and normal temperature bonding are known as the direct bonding method. Fusion bonding using a solder material or low melting point glass as bonding members or adhesion bonding using an adhesive resin has been used as the indirect bonding method.

However, both of the bonding methods need a heating step. Generally, when such heating is applied, a substrate having a semiconductor wafer and a cap wafer bonded thereto (hereinafter called "bonded substrate") undergoes large warpage owing to the difference of coefficient of thermal expansion between the semiconductor wafer and the cap wafer. This warpage of the bonded substrate may result in inferior performance of a product and product handling defect.

Various bonding processes have been proposed as means for reducing warpage of the bonded substrates described above.

Patent Literature 1, for example, describes a wafer bonding process for reducing warpage of bonded substrates by executing wafer bonding of semiconductor wafers (or cap wafers) to which half cut is applied in advance.

Patent Literature 2 describes a wafer bonding process for reducing warpage of bonded substrates which process utilizes an exothermic reaction of reactive foil, bonds wafers by local heating for a short time and reduces warpage of the bonded substrates.

CITATION LIST

Patent Literature

Patent Literature 1: JP-A-2009-177034
Patent Literature 2: JP-A-2009-530867

SUMMARY OF INVENTION

Technical Problem

However, the technologies of Patent Literature 1 and Patent Literature 2 invite problems in the aspect of cost and bonding quality.

The bonding process of Patent Literature 1 uses the semiconductor wafer (or the cap wafer) to which half cut is applied in advance. When a wafer is subjected to machining such as dicing before bonding, the possibility becomes higher that the wafer surface is contaminated by dicing dust. In case the wafer surfaces are contaminated, the contaminant foreign maters exist on the wafer-bonded interface. The contaminant foreign matters may result in deterioration of strength and reliability of wafer bonding. Because half dicing is applied, the strength of the wafer itself becomes lower. Therefore, handling may become more difficult during wafer bonding.

In the bonding process of Patent Literature 2, reactive foil is interposed between the semiconductor wafer and the cap wafer and exothermy of the reactive foil melts the bonding members formed beforehand on the wafer surfaces to achieve wafer bonding. When such a foil-like matter exists between the bonding members, surface oxidation becomes a problem. When solder is taken into consideration as the bonding members, the solder molten by reaction heat of the reactive foil does not wet the reactive foil and voids exist in the solder after bonding. The existence of such voids may also result in deterioration of strength and reliability of wafer bonding. As one of the methods for avoiding the influences of the surface oxide film, the surface oxide film of the reactive foil must be removed by applying surface treatment (sputtering, flux coating chemical etching, etc) to the reactive foil before bonding. However, such surface treatment is not desirable from the aspect of the low cost because it results in the addition of process steps.

The invention is completed in view of the problems described above and is directed to accomplish reduction of warpage during wafer bonding through a simple process and at a low cost and to overcome the problems of the prior art technologies.

Solution to Problem

To solve the problems described above, the invention has its greatest feature in that it uses flux paste containing two or more kinds of powdery materials having reactivity in a wafer bonding process as described in Claims. More concretely, in a method for manufacturing a wafer-bonded semiconductor device by bonding a first wafer substrate and a second wafer substrate together, a method of the invention includes a first step of forming in advance bonding members having a bonding function when heated on the wafer-bonded surface sides of the first wafer substrate and the second wafer substrate; a second step of supplying flux paste containing two or more kinds of powdery materials having reactivity to the surfaces of the bonding members formed in the first step; and a third step of causing excitation for starting the reaction of the flux paste supplied in the second step.

According to another aspect of the invention, in a method for manufacturing a wafer-bonded semiconductor device including a first wafer substrate, a functional device mounted onto the first wafer substrate and a second wafer substrate wherein the functional device is mounted when the first wafer substrate and the second wafer substrate are bonded; a method of the invention includes a first step of forming bonding members having a bonding function when heated at a portion of the first wafer substrate on which the functional device is mounted; a second step of supplying flux paste containing two or more kinds of powdery materials having reactivity to the surfaces of the bonding members formed in the first step; a third step of mounting the functional device onto the flux paste supplied in the second step; and a fourth step of causing excitation to have the flux paste containing the powdery materials, having reactivity and supplied in the third step start reacting.

Advantageous Effects of Invention

The bonding process of the invention can provide a wafer-bonded semiconductor device with less warpage during wafer bonding through an economical and simple process.

DESCRIPTION OF EMBODIMENTS

Figure 1:
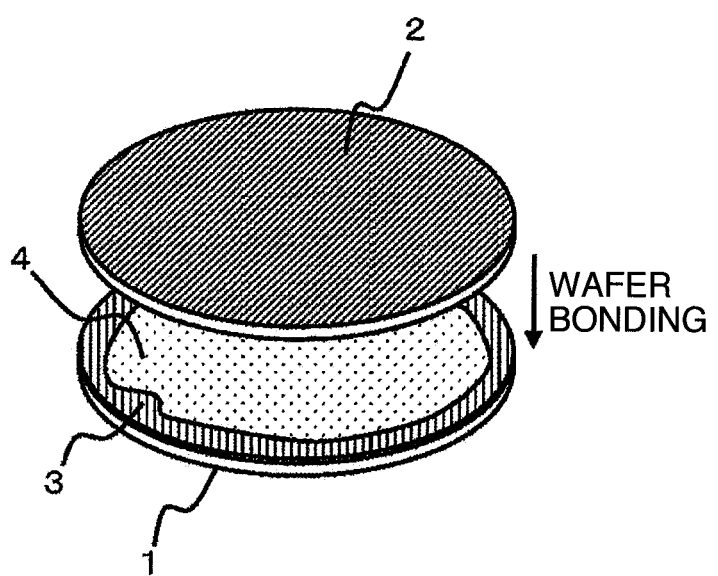
FIG. 1 is a drawing for explaining a wafer-bonded structure in Embodiment 1.

Embodiments of the invention will be explained hereinafter with reference to the drawings. By the way, the same reference numeral will be assigned to identify the same constituent member and repetition of explanation will not be made.

Embodiment 1

First, Embodiment 1 of the invention will be explained with reference to FIGS. 1 to 4.

Figure 2:
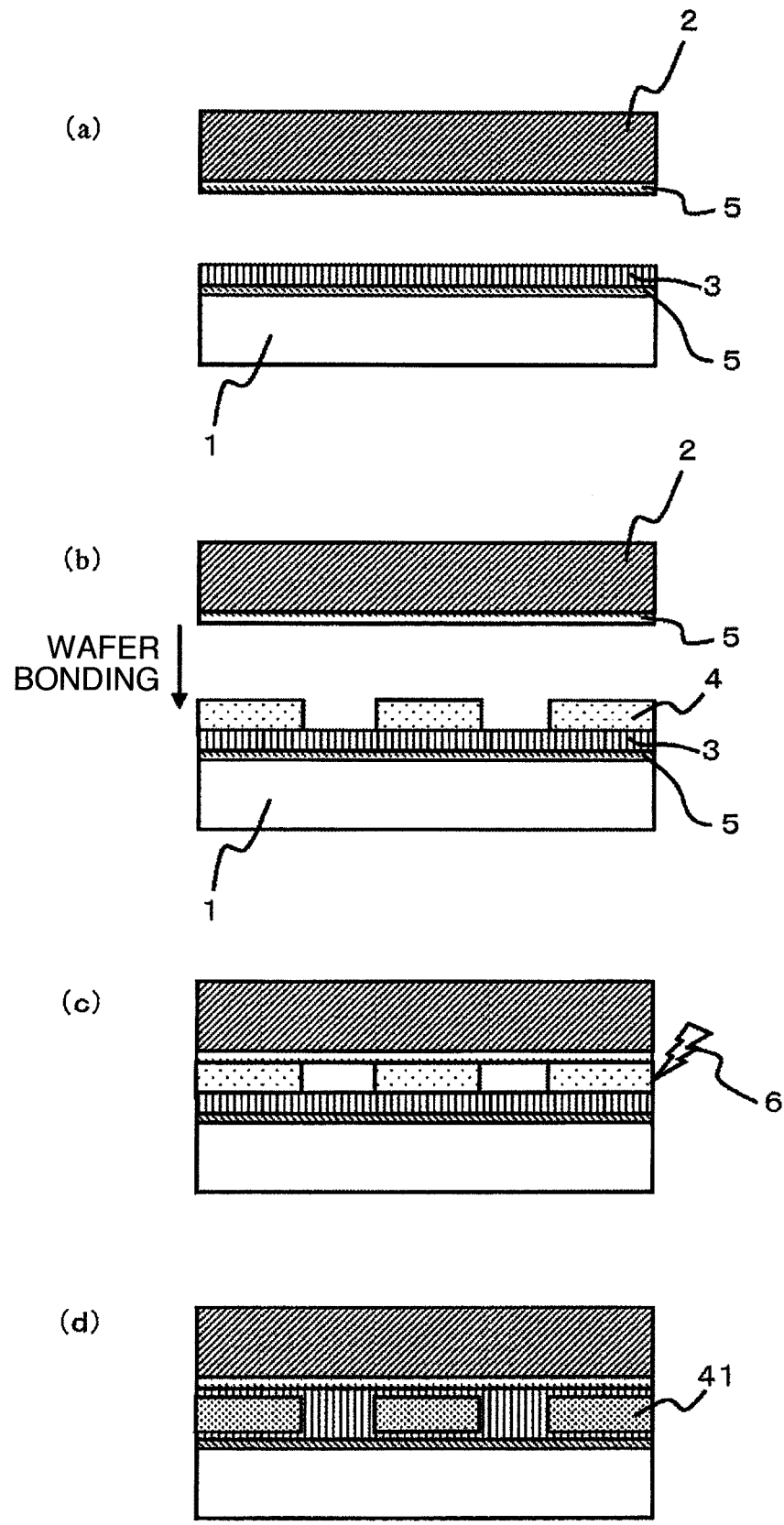
FIG. 2 is a drawing for explaining a wafer bonding process in Embodiment 1.
Figure 3:
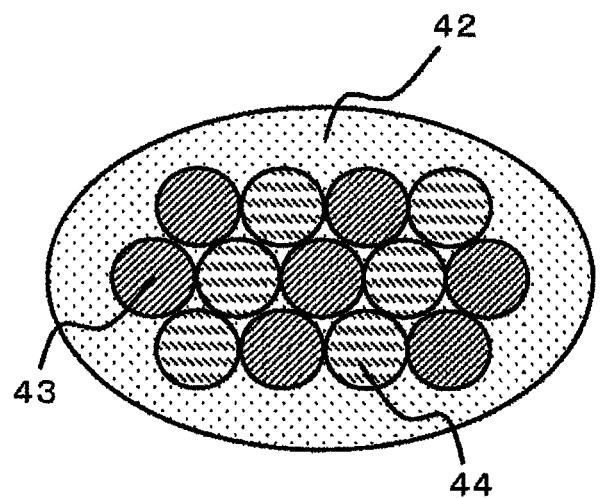
FIG. 3 is a drawing for explaining a structural example of flux paste containing reactive powdery materials in Embodiment 1.
Figure 4:
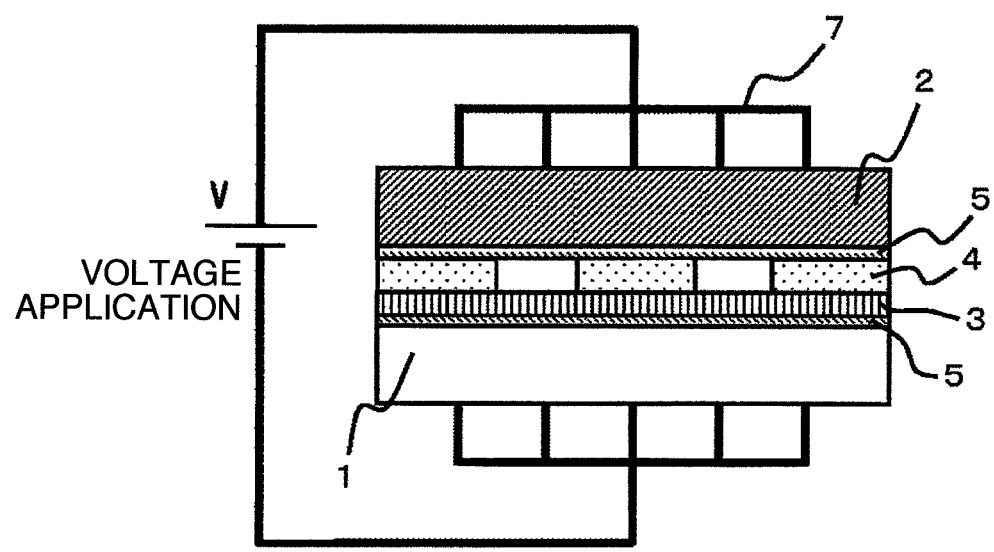
FIG. 4 is a drawing for explaining one form of an external excitation method of flux paste containing reactive powdery materials in Embodiment 1.

FIG. 1 is a drawing for explaining a wafer-bonded structure in Embodiment 1. FIG. 2 is a sectional view for explaining a wafer bonding process in Embodiment 1. FIG. 3 is a drawing for explaining a structural example of flux paste containing reactive powdery materials in Embodiment 1. FIG. 4 is a drawing for explaining one form of an external excitation method of the flux paste containing the reactive powdery materials in Embodiment 1. Incidentally, it would be readily understood by those skilled in the art that the upper surface and the lower surface of a substrate are not the same section but are exploded sectional views in FIGS. 2 and 4. This also holds true of subsequent Embodiments.

To begin with, a wafer-bonded structure in Embodiment 1 will be explained with reference to FIG. 1.

Embodiment 1 is an embodiment that assumes wafer bonding of a first wafer substrate 1 and a second wafer substrate 2. The first wafer substrate 1 is a Si wafer (thermal expansion coefficient: 3.3 ppm/K) that has been used most as a substrate of semiconductor devices. The second wafer substrate 2 uses an amorphous glass material (thermal expansion coefficient: 3.3-8.00 ppm/K) having light transmission property by assuming the application to optical devices. Boric acid type glass is generally used as the glass material of the second wafer substrate 2 when bonding with the Si wafer is taken into consideration. For, warpage of the substrates resulting from the difference of thermal expansion coefficient does not become a problem because the thermal expansiopn coefficient of the boric acid type glass is approximate to that of Si. When much importance is attached to optical properties such as refractive index and transmittance, however, the boric acid type glass is not always an optimal glass material. In this embodiment, too, the second wafer substrate 2 is an amorphous glass material other than the boric acid type glass.

A bonding member 3 for bonding the first wafer substrate and the second wafer substrate exists on the surface of the first wafer substrate 1. In this Embodiment, evaporation solder is formed beforehand as the bonding member 3 on the surface of the first waver substrate 1. Furthermore, flux paste 4 containing the reactive powdery materials is supplied onto the bonding member 3. The bonding member 3 is allowed to exhibit its bonding function by heat generated by the exothermic reaction of the flux paste 4 containing the reactive powdery materials and to bond the first wafer substrate 1 and the second wafer substrate 2.

By the way, the first wafer substrate 1 is not always limited to Si and other semiconductor wafers such as InP, GaAs, SiC, SiGe, GaN and so forth may be used, as well. Furthermore, the first wafer substrate 1 is not limited to the semiconductor material and may be formed naturally of other materials such as a glass material, a ceramic material, a metal material, and so forth.

Similarly, the second wafer substrate 2 is not limited to the glass material but may be formed of other materials such as the semiconductor material, the ceramic material, the metal material, and so forth.

The bonding member 3 need not be limited to the evaporation solder but may be those members that exhibit the bonding function when they are heated, such as solder paste, heat-setting adhesive, and the like.

Next, the wafer bonding process in Embodiment 1 will be explained with reference to FIG. 1.

First, evaporation solder is formed as a bonding member 5 having a bonding function when heated on the bonding surface sides of the first and second wafer substrates 1 and 2. When a solder material such as the evaporation solder is used as the bonding member 5, metal metalize 5 is formed on the bonding surface of the first wafer substrate 1 on the bonding side to the second wafer substrate 2 to secure wettability of the solder. This metal metalize 5 has a laminate structure where Ni: 2 to 5 μm and AuO: 0.05 μm are plated. Incidentally, an intermetallic compound is formed after bonding on the interface between the solder material and Au. Because this intermetallic compound is hard and has a low stress buffering effect, it lowers reliability of bonding against impact, etc. When Au remains, the intermetallic compound grows further as the bonding member is left standing at a high temperature, so that the occurrence of Kirkendall voids in the solder and the drop of reliability and air-tightness become the matters of concern. Therefore, the Au plating thickness is preferably decreased as much as possible. In this Embodiment, the Au plating thickness is set to 0.05 μm.

Next, in FIG. 2(b), the flux paste 4 containing the reactive powdery materials is supplied onto the bonding member 5 (evaporation solder) formed on the first wafer substrate 1 in FIG. 1(a). In this Embodiment, the flux paste 4 containing the reactive powdery materials is supplied through coating by using spin coating as its supplying method. Incidentally, the supplying method of the flux paste 4 containing the reactive powdery materials is not limited to spin coating but the flux paste may be supplied by atomization and squeezing. It is one of the merits of the invention that freedom of the supplying method is higher than the prior art technology because the reactive materials have a paste-like form in the invention. The flux paste 4 containing the reactive powdery materials has the construction where two or more kinds of reactive powdery materials 43 and 44 causing SHS (Self-Propagation High-Temperature Synthesis Reaction) are contained in flux paste 42 used for removing an oxide film in ordinary solder bonding as shown in FIG. 3. In this Embodiment, Al and Ni are used as the reactive powdery materials 43 and 44, respectively. Quite naturally, the reactive powdery materials 43 and 44 need not be limited to Al and Ni and combinations causing the self-propagating high-temperature synthesis reaction such as Ti and C and Al and Ti may be used, too. Needless to say, the reactive powdery material need not be limited to the combination of two kinds of materials but the combinations of two or more kinds of materials may of course be used as long as the combinations are those which generate the self-propagating high-temperature synthesis reaction. This also holds true of the following Embodiments.

Next, the first wafer substrate 1 and the second wafer substrate 2 are registered in FIG. 2(c) and the reaction of the flux paste 4 containing the reactive powdery materials and existing between the first wafer substrate 1 and the second wafer substrate 2 is allowed to start by external excitation 6. This Embodiment uses laser excitation as external excitation 6. When a laser beam is radiated to the flux paste 4 containing the reactive powdery materials, the reactive materials 43 and 44 contained in the flux paste 4 containing the reactive powdery materials undergo the reaction. Because this reaction is the self-propagating high-temperature synthesis reaction, the reaction propagates throughout the flux paste 4 containing the reactive powdery materials when a part of the flux paste 4 undergoes the reaction. The propagation speed is extremely high and is generally completed within one second. The exothermic temperature at this time is higher than 1,000° C. Therefore, the wafer bonded surfaces can be heated as a whole with extremely small excitation energy and within an extremely short time. Because the reaction is completed within a short time, the temperature rise of the first wafer substrate 1 and the second wafer substrate 2 does not rise unnecessarily and warpage of the bonded substrates resulting from the difference of the thermal expansion coefficients between the first wafer substrate 1 and the second wafer substrate 2 can be reduced.

The method of external excitation 6 need not be limited to laser excitation and those methods which can initiate the self-propagating high-temperature synthesis reaction of the reactive powdery materials 43 and 44 in flux paste 4 containing the reactive powdery materials typified by spark, application of voltage, heating, and so forth, can be naturally employed. Since the excitation methods such as laser excitation, spark and voltage application can execute local heating, these methods have the merit that the temperature rise of the first wafer substrate 1 and the second wafer substrate 2 can be suppressed. Though they are heating methods, the methods execute heating only in the necessary quantity for the self-propagating high-temperature synthesis reaction. Therefore, warpage resulting from the heat of reaction becomes less. FIG. 4 shows one form of the external excitation method. In FIG. 4, voltage excitation is applied to the flux paste 4 containing the reactive powdery materials by applying the voltage across the first wafer substrate 1 and the second wafer substrate 2. Owing to this voltage application, the reactive powdery materials 43 and 44 undergo the self-propagating high-temperature synthesis reaction and exothermy is acquired. This method is a process having high matching with equipment having a wafer bonding mechanism and a voltage application mechanism such as an anodic bonding machanism and has the merit that an investment of new equipment and the change of the existing bonding process are not necessary.

Next in FIG. 2(d), the bonding member 3 (evaporation solder) formed on the first wafer substrate 1 is molten by the heat of reaction of the flux paste 4 containing the reactive powdery materials and the first wafer substrate 1 and the second wafer substrate 2 are bonded. Incidentally, the reaction synthesis product 41 of the reactive powdery materials 43 and 44 synthesized by the self-propagating high-temperature synthesis reaction remains in the solder after the first wafer substrate 1 and the second wafer substrate 2 are bonded.

According to the wafer bonding process explained in this Embodiment, the solder material is molten by exothermy of the self-propagating high-temperature synthesis reaction in the flux paste 4 containing the reactive powdery materials which reaction finishes within the short period of time. Therefore, the temperature rise of the first wafer substrate 1 and the second wafer substrate 2 can be suppressed during wafer bonding. In other words, since the temperature rise of the first wafer substrate 1 and the second wafer substrate 2 becomes small, warpage of the bonded substrates resulting from the difference of the coefficient of thermal expansion between the first wafer substrate 1 and the second wafer substrate 2 can be reduced.

Because the self-propagating high-temperature synthesis reaction is generated in the flux paste, the effect of removing the oxide film by the flux paste can be expected and bonding defects such as voids and low wettability can be avoided.

The additional merits are the improvement in freedom of the supplying method brought forth by the paste-like reactive materials and extremely small energy supply required for bonding as described already.

Embodiment 2

Figure 5:
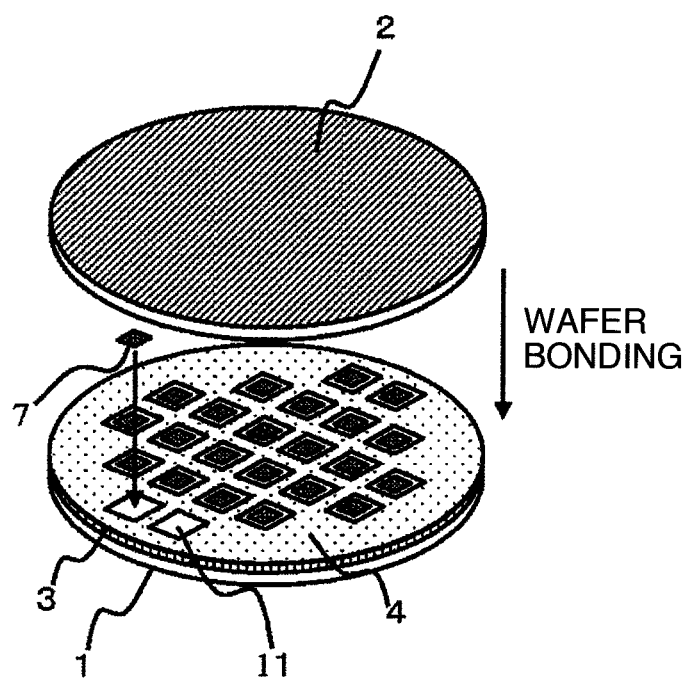
FIG. 5 is a drawing for explaining a wafer-bonded structure in Embodiment 2.
Figure 6:
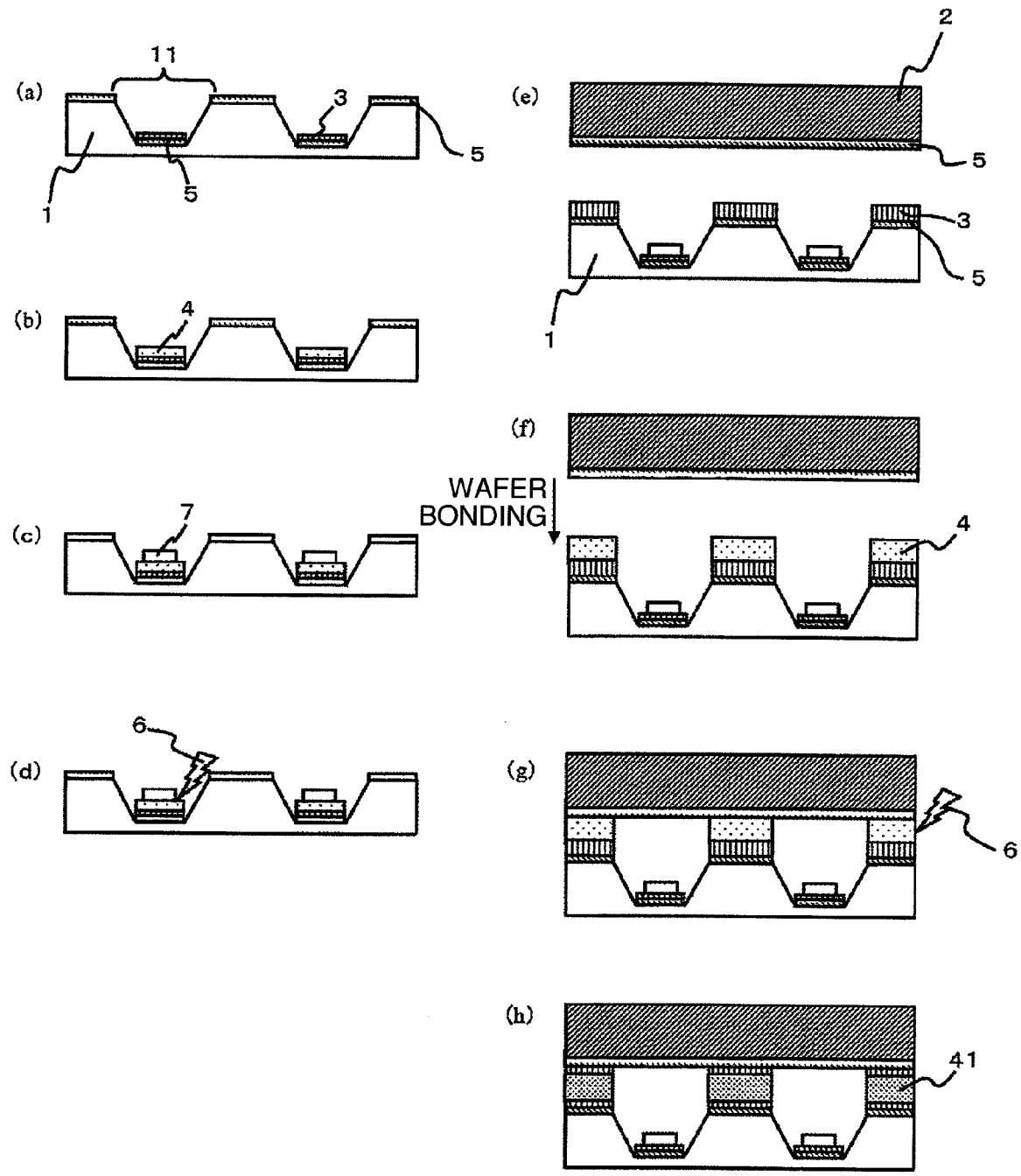
FIG. 6 is a drawing for explaining a wafer bonding process in Embodiment 2.

Embodiment 2 of the invention will be explained with reference to FIG. 5 and FIG. 6. FIG. 5 is a drawing for explaining a wafer-bonded structure in Embodiment 2. FIG. 6 is a drawing for explaining a wafer bonding process in Embodiment 2.

First, a wafer bonding structure in Embodiment 2 will be explained with reference to FIG. 5.

Embodiment 2 assumes an embodiment where a functional device 7 is mounted to the first wafer substrate 1 and is sealed by wafer-bonding the second wafer substrate 2. In this embodiment, too, the first wafer substrate 1 is a Si wafer (thermal expansion coefficient: 3.3 ppm/K) that has been used most as a substrate of semiconductor devices in the same way as in Embodiment 1. Trapezoidal cavities 11 are formed by Si anisotropic etching on the first wafer substrate 1. A surface emitting laser (VCSEL: Vertical Cavity Surface Emitting Laser) is mounted as the functional device 7 to each trapezoidal cavity 11. The second wafer substrate 2 uses an amorphous glass material (thermal expansion coefficient: 3.3-8.0 ppm/K) by assuming transmission of light from the VCSEL (functional device 7).

A bonding member 3 for bonding the first wafer substrate and the second wafer substrate exists on the surface of the first wafer substrate 1. In this Embodiment, too, the evaporation solder is formed in advance as the bonding member 3 on the surface of the first waver substrate 1 in the same way as in Embodiment 1. Furthermore, flux paste 4 that contains reactive powder materials is supplied onto the bonding member 3. The bonding member 3 is allowed to exhibit its bonding function by heat generated by the exothermic reaction of the flux paste 4 containing the reactive powdery materials and to bond the first wafer substrate 1 and the second wafer substrate 2, so that the functional device 7 is packaged and an optical module device that is wafer-level packaged is formed.

By the way, the functional device 7 need not be limited to VCSEL but may be light receiving devices such as photo diodes (PD). Furthermore, the functional device 7 need not be limited to the optical devices but may be logical IC and sensor IC.

When an optical device is used as the functional device 7, the second wafer substrate 2 need not be limited to the glass material but may be formed of materials permitting transmission of light of the wavelength that the functional device 7 emits o receives. When the functional device 7 is not the optical device, the second wafer substrate 2 may naturally be formed of other materials such as a glass material, a ceramic material and a metal material.

Incidentally, the first wafer substrate 1 need not be limited to Si but may be other semiconductor wafers such as InP, GaAs, SiC, SiGe, GaN, and so forth. Furthermore, the first wafer substrate may naturally be formed of other materials such as a glass material, a ceramic material and a metal material.

The bonding member 3 need not be limited to the evaporation solder but may be a member that exhibits the bonding function when heated, such as solder paste, a heat-setting adhesive, and the like.

Next, a wafer bonding process in Embodiment 1 will be explained with reference to FIG. 6.

First, the evaporation solder is formed as the bonding member 5 having the bonding function when heated in each trapezoidal cavity 11 of the first wafer substrate 1 to which the functional device 7 is mounted in FIG. 6(a). Metal metalize 5 is formed to secure wettability of the solder in this Embodiment in the same way as in Embodiment 1. The structure of this metal metalize 5 has a laminate structure of Ni: 2 to 5 and Au: 0.5 µm.

Next, in FIG. 6(b), the flux paste 4 containing the reactive powdery materials is supplied onto the evaporation solder formed in each trapezoidal cavity 11 of the first wafer substrate 1 in FIG. 6(a). The flux paste 4 containing the reactive powdery materials is supplied by dispensing.

After the functional device 7 is mounted onto the flux paste 4 in each trapezoidal cavity 11 of the first wafer substrate 1 having the flux paste 4 in FIGS. 6(c) and (d), laser excitation is carried out as external excitation 6 to cause the self-propagating high-temperature synthesis reaction of the flux paste 4 containing the reactive powdery materials which paste is supplied in FIG. 6(b). In this Embodiment, the flux paste 4 containing the reactive powdery materials has the construction shown in FIG. 3 where two or more kinds of reactive powdery materials 43 and 44 causing SHS (Self-Propagation High-Temperature Synthesis Reaction) are contained in flux paste 42 that is generally used for removing an oxide film in ordinary solder bonding as shown in FIG. 3 in the same way as in Embodiment 1. The bonding member 3 (evaporation solder) supplied in FIG. 6(a) is molten by the heat generated at that time and the first wafer substrate 1 and the functional device 7 are bonded. After this step, the reaction synthesis product 41 of the reactive powdery materials 43 and 44 synthesized by the self-propagation high-temperature synthesis reaction remains in the solder that bonds the first wafer substrate 1 and the functional device 7 but this product is not shown in FIG. 6(d) because illustration gets complicated.

In this Embodiment, the steps in FIGS. 6(a) to (d) are repeatedly carried out and the functional devices 7 are bonded to all the trapezoidal cavities 11 formed in the first wafer substrate.

Generally, when semiconductor devices are manufactured by wafer level packaging, the functional devices are mounted one after another onto the first wafer substrate 1. In this instance, the functional devices 7 are bonded to the first wafer substrate 1 by generally using a solder material. In semiconductor devices having large allowance for the positioning error of mounting, all the functional devices 7 are provisionally mounted to the first wafer substrate 1 by using paste as the solder material and the wafer is then passed through a reflow furnace to achieve bonding.

When wafer level packaging is applied to optical device modules requiring high positioning accuracy of mounting of the functional devices 7, on the other hand, the reflow furnace which invites the positioning error of mounting cannot be utilized. Therefore, it has been indispensably necessary to heat successively the functional devices 7 by heat pressure bonding, etc and then to bond them successively by melting the solder material. When successive bonding of the functional devices 7 is made by this method, however, heat of bonding affects the solder material formed at the mounting portions of the adjacent functional devices 7. In the worst case, there is the possibility that an oxide film is formed on the surface of the solder material and bonding of the successive functional devices 7 cannot be made any longer.

In the process in FIGS. 6(a) to (d) of this Embodiment, however, exothermy of the self-propagation high-temperature synthesis reaction of the flux paste 4 containing the reactive powdery materials is used as the heat source for melting the solder material, and heating is local heating conducted within a short time. Therefore, the method is the one that has an extremely small influence on the solder material of the mounting portions of the adjacent functional devices 7 and can be said an appropriate method for successive mounting the functional devices 7.

In this Embodiment, after the functional devices 7 are successively mounted to the trapezoidal cavities 11 of the first wafer substrate 1, packaging is carried out by bonding the first wafer substrate 1 and the second wafer substrate 2. The wafer bonding method of the first wafer substrate 1 and the second wafer substrate 2 is the same as that of Embodiment 1.

More concretely, evaporation solder as the bonding member 5 having the bonding function is formed by heating on the bonded surface side of the first substrate 1 to the second wafer substrate 2 in FIG. 6(e). Metal metalize 5 formed of Ni: 2 to 5 µm and Au: 0.5 µm is formed to secure wettability of the solder on the bonded surface sides of the first wafer substrate 1 and the second wafer substrate 2.

Next, in FIG. 6(f), the flux paste 4 containing the reactive powdery materials is supplied onto the evaporation solder formed on the first wafer substrate 1 in FIG. 6(e). In this Embodiment, too, the flux paste 4 is supplied by application by spin coating as the supplying method of the flux paste 4 containing the reactive powdery materials. In the same way as in Embodiment 1, the flux paste 4 containing the reactive powdery materials has the construction where two or more kinds of reactive powdery materials 43 and 44 causing SHS (Self-Propagation High-Temperature Synthesis Reaction) are contained in the flux paste 42 used for removing an oxide film in ordinary solder bonding as shown in FIG. 3.

Next, the first wafer substrate 1 and the second wafer substrate 2 are registered in FIGS. 6(g) and (h) and the reaction of the flux paste 4 containing the reactive powdery materials and existing between the first wafer substrate 1 and the second wafer substrate 2 is allowed to start by external excitation 6. Heat of reaction at this time melts the evaporation solder formed on the first wafer substrate 1 and the first wafer substrate 1 and the second wafer substrate 2 are bonded. Though this embodiment uses laser excitation as external excitation 6, external excitation may be applied by applying a voltage between the first wafer substrate 1 and the second wafer substrate 2 as shown in FIG. 4.

According to the wafer bonding process explained in this embodiment, the solder material is molten by exothermy of the self-propagating high-temperature synthesis reaction in the flux paste 4 containing the reactive powdery materials which reaction finishes by local heating within a short period of time. Therefore, this method exerts an extremely small influence on the solder material of the mounting portions of the adjacent functional devices 7 and can execute successive mounting of the functional devices 7.

Because the solder material is molten by exothermy of the self-propagating high-temperature synthesis reaction in the flux paste 4 containing the reactive powdery material and finishing within the short period of time, the temperature rise of the first wafer substrate 1 and the second wafer substrate 2 can be suppressed. In other words, since the temperature rise of the first wafer substrate 1 and the second wafer substrate 2 becomes small, warpage of the bonded substrates resulting from the difference of the coefficient of thermal expansion between the first wafer substrate 1 and the second wafer substrate 2 can be reduced.

Because the self-propagating high-temperature synthesis reaction is generated in the flux paste, the effect of removing the oxide film by the flux paste can be expected and bonding defects such as voids and inferior wettability can be avoided.

An accompanying merit is the improvement in freedom of the supplying method brought forth by the paste-like reactive materials and extremely small energy supply required for bonding as described already.

INDUSTRIAL APPLICABILITY

In the manufacture of semiconductor devices, the invention can be utilized as a wafer bonding process directed to air-tight molding and wafer level packaging.

REFERENCE SIGNS LIST

1 . . . first wafer substrate
12 . . . trapezoidal cavity
2 . . . second wafer substrate
3 . . . bonding member
4 . . . flux paste containing reactive powdery materials
41 . . . reaction synthesis product
42 . . . flux paste
43 . . . first reactive powdery material
44 . . . second reactive powdery material
5 . . . metal metalize
6 . . . external excitation
7 . . . functional device

The invention claimed is:

1. A method for manufacturing a wafer-bonded semiconductor device by bonding a first wafer substrate and a second wafer substrate together, comprising:
   a first step of forming in advance a bonding member having a bonding function when heated on the wafer-bonded surface sides of said first wafer substrate and said second wafer substrate;
   subsequent to forming the bonding member, a second step of supplying flux paste containing two or more kinds of powdery materials having reactivity to the surface of said bonding member formed in said first step;
   a third step of causing excitation for starting the reaction of said flux paste supplied in said second step;
   a fourth step of reacting the flux paste, the reaction of the flux paste being an exothermic reaction; and
   a fifth step of allowing the bonding member to exhibit its bonding function by heat generated by the exothermic reaction of the flux paste.

2. A method for manufacturing a semiconductor device according to claim 1, wherein said flux paste undergoes a self-propagating high-temperature synthesis reaction.

3. A method for manufacturing a semiconductor device according to claim 1, wherein said excitation is executed by radiating a laser beam in said third step.

4. A method for manufacturing a semiconductor device according to claim 1, wherein the reaction of said flux paste is started by applying a voltage between a surface of said first wafer substrate on which said bonding member is not formed and a surface of said second wafer substrate on which said bonding member is not formed, and said first wafer substrate and said second wafer substrate are bonded.

5. A method for manufacturing a wafer-bonded semiconductor device including a first wafer substrate; a functional device mounted onto said first wafer substrate; and a second wafer substrate; said functional device being mounted when said first wafer substrate and said second wafer substrate are bonded;
   said manufacturing method comprising:
   a first step of forming a bonding member, having a bonding function when heated, at a position of said first wafer substrate on which said functional device is mounted;
   subsequent to said first step, a second step of supplying flux paste containing two or more kinds of powdery materials having reactivity to the surface of said bonding member formed in said first step;
   a third step of mounting said functional device onto said flux paste supplied in said second step;
   a fourth step of causing excitation to have said flux paste supplied in said third step start reacting;
   a fifth step of reacting the flux paste, the reaction of the flux paste being an exothermic reaction; and
   a sixth step of allowing the bonding member to exhibit its bonding function by heat generated by the exothermic reaction of the flux paste.

6. A method for manufacturing a semiconductor device according to claim 5, which further comprises:
   a seventh step of forming, after said fourth step, a bonding member having a bonding function when heated on the wafer bonded surface sides of said first wafer substrate and said second wafer substrate;
   an eighth step of supplying said flux paste to the surface of said bonding member formed by said seventh step; and
   a ninth step of causing excitation to have said flux paste supplied in said eighth step start reacting.

7. A method for manufacturing a semiconductor device according to claim 5, wherein said functional device is a light emitting device or a light receiving device and said second wafer substrate is a material permitting transmission of light.

8. A method for manufacturing a semiconductor device according to claim 5, wherein said flux paste undergoes a self-propagating high-temperature synthesis reaction.

9. A method for manufacturing a semiconductor device according to claim 5, wherein a laser beam is radiated to cause excitation in said fourth step.

10. A method for manufacturing a semiconductor device according to claim 5, wherein said flux paste is allowed to start the reaction by applying a voltage between the surface of said first wafer substrate on which said bonding member is not formed and the surface of said second wafer substrate on which said bonding member is not formed, and said first wafer substrate and said second wafer substrate are bonded.

11. A method for manufacturing a semiconductor device according to claim 1, wherein said two or more kinds of powdery materials are:
aluminum and nickel; or
aluminum and titanium; or
titanium and carbon.

12. A method for manufacturing a semiconductor device according to claim 1, wherein evaporation solder is used as said bonding member having a bonding function when heated.

13. A method for manufacturing a semiconductor device according to claim 6, wherein said functional device is a light emitting device or a light receiving device and said second wafer substrate is a material permitting transmission of light.

14. A method for manufacturing a semiconductor device according to claim 6, wherein said flux paste undergoes a self-propagating high-temperature synthesis reaction.

15. A method for manufacturing a semiconductor device according to claim 6, wherein a laser beam is radiated to cause excitation in said fourth step or said ninths step.

16. A method for manufacturing a semiconductor device according to claim 6, wherein said flux paste is allowed to start the reaction by applying a voltage between the surface of said first wafer substrate on which said bonding member is not formed and the surface of said second wafer substrate on which said bonding member is not formed, and said first wafer substrate and said second wafer substrate are bonded.

17. A method for manufacturing a semiconductor device according to claim 5, wherein said two or more kinds of powdery materials are:
aluminum and nickel; or
aluminum and titanium; or
titanium and carbon.

18. A method for manufacturing a semiconductor device according to claim 6, wherein said two or more kinds of powdery materials are:
aluminum and nickel; or
aluminum and titanium; or
titanium and carbon.

19. A method for manufacturing a semiconductor device according to claim 5, wherein evaporation solder is used as said bonding member having a bonding function when heated.

20. A method for manufacturing a semiconductor device according to claim 6, wherein evaporation solder is used as said bonding member having a bonding function when heated.

21. A method for manufacturing a semiconductor device according to claim 1, wherein the two or more kinds of powdery materials of the flux paste react in said exothermic reaction.

22. A method for manufacturing a semiconductor device according to claim 1, wherein the two or more kinds of powdery materials react with each other in the exothermic reaction, a reaction synthesis product of the reaction of the two or more kinds of powdery materials remaining in the bonded product of the first wafer substrate and the second wafer substrate.

23. A method for manufacturing a semiconductor device according to claim 1, wherein said flux paste is a flux paste for removing an oxide film from said bonding member.

24. A method for manufacturing a semiconductor device according to claim 5, wherein the two or more kinds of powdery materials react in said exothermic reaction.

25. A method for manufacturing a semiconductor device according to claim 5, wherein the two or more kinds of powdery materials react with each other in the exothermic reaction, a reaction synthesis product of the reaction of the two or more kinds of powdery materials remaining in the bonded product of the first wafer substrate and the functional device.

26. A method for manufacturing a semiconductor device according to claim 5, wherein said flux paste is a flux paste for removing an oxide film from said bonding member.

* * * * *